(12) United States Patent
Furuyama

(10) Patent No.: US 8,279,673 B2
(45) Date of Patent: Oct. 2, 2012

(54) NON-VOLATILE SEMICONDUCTOR MEMORY

(75) Inventor: Takaaki Furuyama, Tokyo (JP)

(73) Assignee: Powerchip Technology Corporation, Hsinchu (TW)

( * ) Notice: Subject to any disclaimer, the term of this patent is extended or adjusted under 35 U.S.C. 154(b) by 84 days.

(21) Appl. No.: 12/640,848

(22) Filed: Dec. 17, 2009

(65) Prior Publication Data

US 2010/0157677 A1    Jun. 24, 2010

(30) Foreign Application Priority Data

Dec. 18, 2008    (JP) .................................. 2008-322407

(51) Int. Cl.
*G11C 11/34*    (2006.01)
(52) U.S. Cl. .................................................. 365/185.17
(58) Field of Classification Search .................. 365/205, 365/206
See application file for complete search history.

(56) References Cited

U.S. PATENT DOCUMENTS

| 5,969,990 | A * | 10/1999 | Arase | 365/185.25 |
| 7,400,534 | B2 * | 7/2008 | Maejima | 365/185.17 |
| 2009/0004843 | A1 * | 1/2009 | Mokhlesi et al. | 438/622 |
| 2010/0061137 | A1 * | 3/2010 | Kim | 365/102 |

FOREIGN PATENT DOCUMENTS

| JP | H09-147582 | 6/1997 |
| JP | 2000-285692 | 10/2000 |
| JP | 2001-28575 | 1/2001 |
| JP | 2003-346485 | 12/2003 |
| JP | 2007-123652 | 5/2007 |

OTHER PUBLICATIONS

Tanaka, "A Quick Intelligent Page-Programming Architecture and a Shielded Bitline Sensing Method for 3 V-Only NAND Flash Memory," IEEE Journal of Solid-State Circuits, Nov. 1994, pp. 1366-1373, vol. 29, No. 11.

* cited by examiner

*Primary Examiner* — Huan Hoang
*Assistant Examiner* — Pablo Huerta
(74) *Attorney, Agent, or Firm* — Muncy, Geissler, Olds & Lowe, PLLC

(57) ABSTRACT

A non-volatile semiconductor memory device is provided so that chip size may not increase and occurrence of misreading induced by capacitance of adjacent global bit lines GBL may be prevented, and includes: a non-volatile memory cell array for recording data by setting a threshold voltage for each memory cell transistor serially connected between selection transistors on terminals of a selected bit line; and a control circuit 11 for reading a bit line and data from the memory cell transistor through a global bit line commonly connected to the bit lines. A ground transistor 23 for connecting the global bit line with a predetermined power line is disposed at a position of the global bit line. The ground transistor 23 activated by the control circuit 11 is adjacent to the global bit line where the data is readout and connected to the global bit line where the data is not readout.

6 Claims, 13 Drawing Sheets

Memory Cell Transistor 20

Selection Gate Transistor 24~27

NON-VOLATILE SEMICONDUCTOR MEMORY

BACKGROUND OF THE INVENTION

1. Field of the Invention

The invention relates to an electrically erasable programmable non-volatile semiconductor memory device (EEPROM), such as a flash memory, etc.

2. Description of the Related Art

A highly integrated NAND-type non-volatile semiconductor memory device (refer to Patent Documents 1-4) well known in the art connects a plurality of memory cell transistors (hereinafter referred to as memory cells) to and between bit lines and source lines in series, so as to form a NAND string.

For a common NAND-type non-volatile semiconductor memory device, when erasing is performed, a high voltage, such as 20V, is applied to a semiconductor substrate thereof and 0V is applied to a word line thereof. As such, electrons are pulled out from a floating gate, i.e., the charge accumulation layer formed by poly-silicon material etc. and, the threshold voltage is lower than the erasing threshold voltage (for example, −3V). In addition, when write-in (programming) is performed, 0V is applied to the semiconductor substrate and a high voltage, such as 20V, is applied to a controlling gate. As a result, electrons are injected from the semiconductor substrate into the floating gate, thereby making the threshold voltage higher than the write-in threshold voltage (for example, 1V). The state of the memory cell which utilizes the threshold voltages may be determined by applying a readout voltage between the write-in threshold voltage and the readout threshold voltage (for example, 0V) to the control gate to determine whether a current is flowing thereto.

However, with the NAND-type flash memory having characteristics of low operating voltage and high density, coupling noise induced by the capacitance between the read bit lines must be addressed. According, a bit line shielding technology (for example, refer to Patent Document 1) is provided to solve the above-mentioned problem, thereby reducing coupling noise between the bit lines. According to the bit line shield technology, when reading pages, every other bit line is readout and the unselected bit lines are grounded. That is, the selected cell and unselected cell are connected to each other to form a control gate line.

In addition, Patent Document 5 illustrates how electrical characteristics of non-volatile memory, such as a flash memory, etc, may be improved and has the following structure. Wiring (signal wiring), forms the first layer of wiring layers. Selection gate transistors are formed in the area of a memory matrix, and the signal wiring is formed on the top of the area of the selection gate transistors. Next, in the area of the memory matrix, shielding wiring is formed in the non-wire area where no signal wiring is present. That is, the shielding wiring is formed on the top of the memory cell matrix area which does not form signal wiring. A global bit line is formed at a second layer of the wiring layers for commonly connecting to a plurality of the bit lines. The shielding wiring formed at the first layer is used to shield the global bit line at the second layer and reduce coupling noise between adjacent global bit lines.

[Patent Document 1] JP H09-147582.
[Patent Document 2] JP 2000-285692.
[Patent Document 3] JP 2003-346485.
[Patent Document 4] JP 2001-028575.
[Patent Document 5] JP 2007-123652.

[Non-Patent Document 1] Tomoharu Tanaka et al., "A Quick Intelligent Page-Programming Architecture and a Shielded Bitline Sensing Method for 3 V-only NAND Flash Memory", IEEE Journal of Solid-State Circuits, Vol. 29, No. 11, pp. 1366-1373, November 1994.

In the bit line shielding technology as illustrated in non-Patent Document 1, every other global bit line is grounded to function as a shielding line during reading/verifying of the NAND-type flash memory. Generally, noise between adjacent bit lines may be prevented when data is read on the global bit line. Transistors for connecting the global bit line to the ground are arranged at a near terminal, or arranged at the near terminal and a far terminal (both terminals of the global bit line) of a page buffer.

The impedance of a global bit line and the capacitance between adjacent bit lines increase along with miniaturization. Meanwhile, the distant ground transistor may attenuate the shielding effectiveness in the middle of the global bit line. As such, it is necessary to divide the global bit line to maintain shielding effectiveness. Thus, an additional page buffer row is necessary due to the division of the global bit line. Accordingly, chip size and chip cost is increased. A detailed description is given as below.

FIG. 10 is a schematic diagram illustrating ground transistor parts 10A and 10B of a memory cell array according to the prior art. Further, FIG. 11 is a timing diagram illustrating the operation of the circuit as shown in FIG. 10. Referring to FIG. 10, ground transistors 21 and 22 are respectively disposed on the ground transistors parts 10A and 10B on two terminals of a global bit line GBL. Cc indicates the capacitance of adjacent global bit lines GBL. As shown in FIG. 11, SGBL indicates a global bit line which is shielded and not read, DGBL indicates a reading global bit line where charges have been discharged from the memory cell and NDGBL indicates a reading global bit line where charges have not been discharged from the memory cell.

Referring to FIG. 10, for example, when a NAND string connected to the point Pb is discharged through a global bit line GBL, coupling noise may overlap on the line between the point Pb and the point Pd of adjacent global bit lines GBL and may even further be transmitted to the line between the point Pe and the point Pf of the adjacent global bit lines GBL. As a result, the line between the point Pe and the point Pf of the adjacent global bit lines GBL is affected. When reading a NAND string which has not been discharged, a drop in voltage of the bit line due to substantially large noise may undesirably result in misreading, as shown in 101 of FIG. 11.

FIG. 12 is a schematic diagram illustrating the ground transistor parts 10A and 10B of another memory cell array according to the prior art. As shown in FIG. 12, in order to mitigate the aforementioned problem, the length of the global bit line GBL is divided by 2 and a page buffer 14 is disposed in the middle. Although the impedance of the global bit line GBL is reduced by half, a problem of an increased chip size may occur.

BRIEF SUMMARY OF THE INVENTION

The invention provides a non-volatile semiconductor memory device to mitigate the aforementioned problem, so that chip size may not increase and occurrence of misreading induced by capacitance of adjacent global bit lines GBL may be prevented.

The non-volatile semiconductor memory device of the invention comprises: a non-volatile memory cell array for recording data by setting a threshold voltage for each memory cell transistor, wherein each memory cell transistor is connected in series between selection gate transistors on two terminals of a selected bit line; and a control circuit for reading a bit line and data from the memory cell transistor through a global bit line commonly connected to a plurality of the bit lines, wherein a switch component for connecting the global bit line with a predetermined power line is disposed at a position of the global bit line.

In the non-volatile semiconductor memory device, the switch component connects the odd number of the global bit lines and the even number of the global bit lines to respective predetermined power lines.

In addition, in the non-volatile semiconductor memory device, the switch component turned on by the control circuit is adjacent to the global bit line where data is readout and is connected to the global bit line where data is not readout.

Further, in the non-volatile semiconductor memory device, the switch component is formed with the same structure as the selection gate transistor.

In addition, in the non-volatile semiconductor memory device, the power line is a power line with a ground voltage level.

Further, in the non-volatile semiconductor memory device, the power line is a source line of the memory cell transistor.

Furthermore, in the non-volatile semiconductor memory device, the memory cell array comprises a plurality of memory cell transistors of a NAND string.

According to the non-volatile semiconductor memory device of the invention, a switch component for connecting the global bit line with the predetermined power line is disposed at a position of the global bit line. The above-mentioned switch component, which is turned on by the control circuit, is adjacent to the global bit line where data is readout and is connected to the global bit line where data is not readout. Therefore, the chip size may not increase and occurrence of misreading induced by capacitance of adjacent global bit lines GBL may be prevented.

DETAILED DESCRIPTION OF THE INVENTION

The embodiments of the invention are given in the following with reference to the accompanying drawings. Further, in the following embodiments, the same number denotes the same element.

Figure 1:
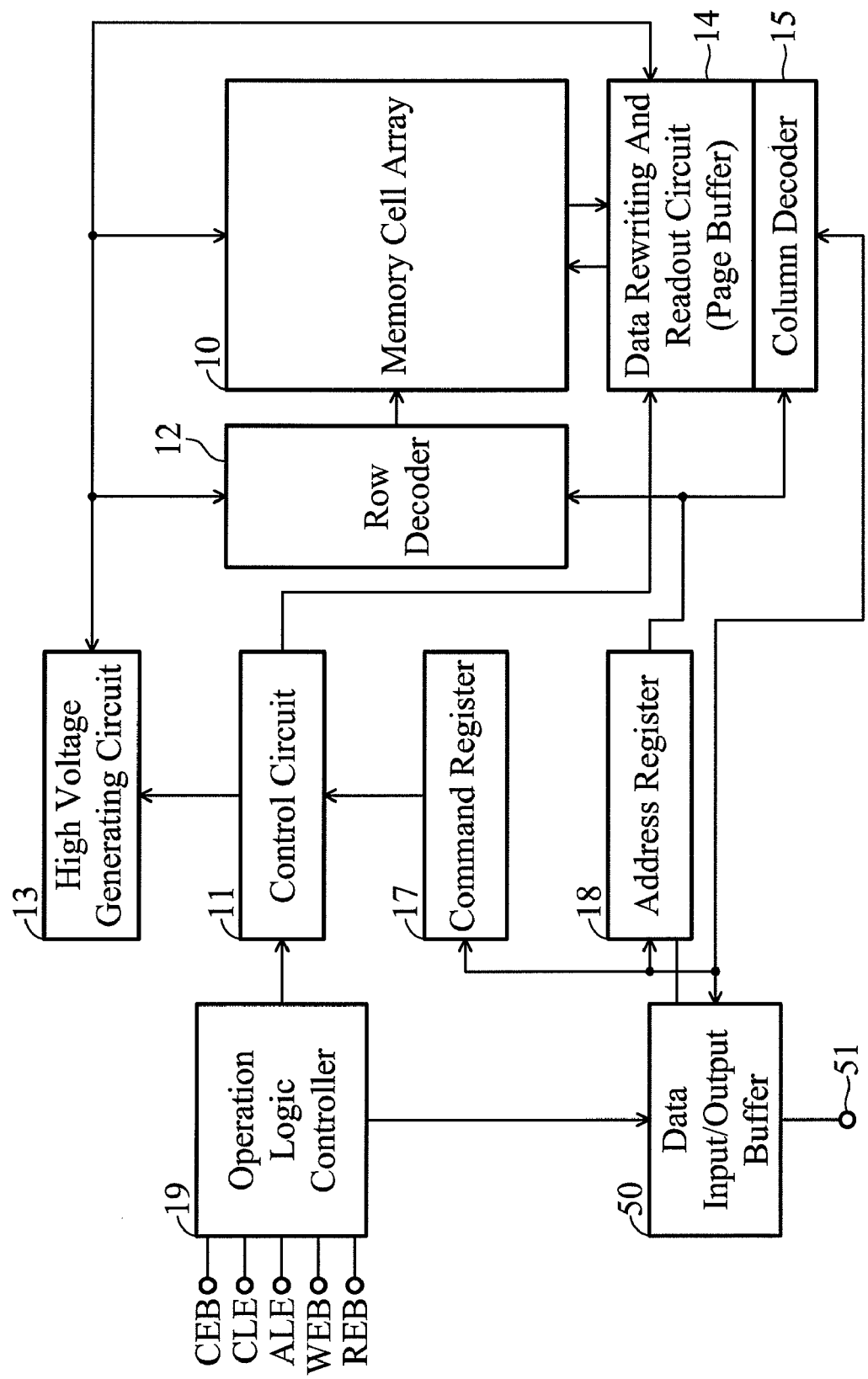
FIG. 1 is a block diagram illustrating the entire structure of a NAND-type flash electrically-erasable programmable read-only memory (EEPROM) according to an embodiment of the invention.
Figure 2:
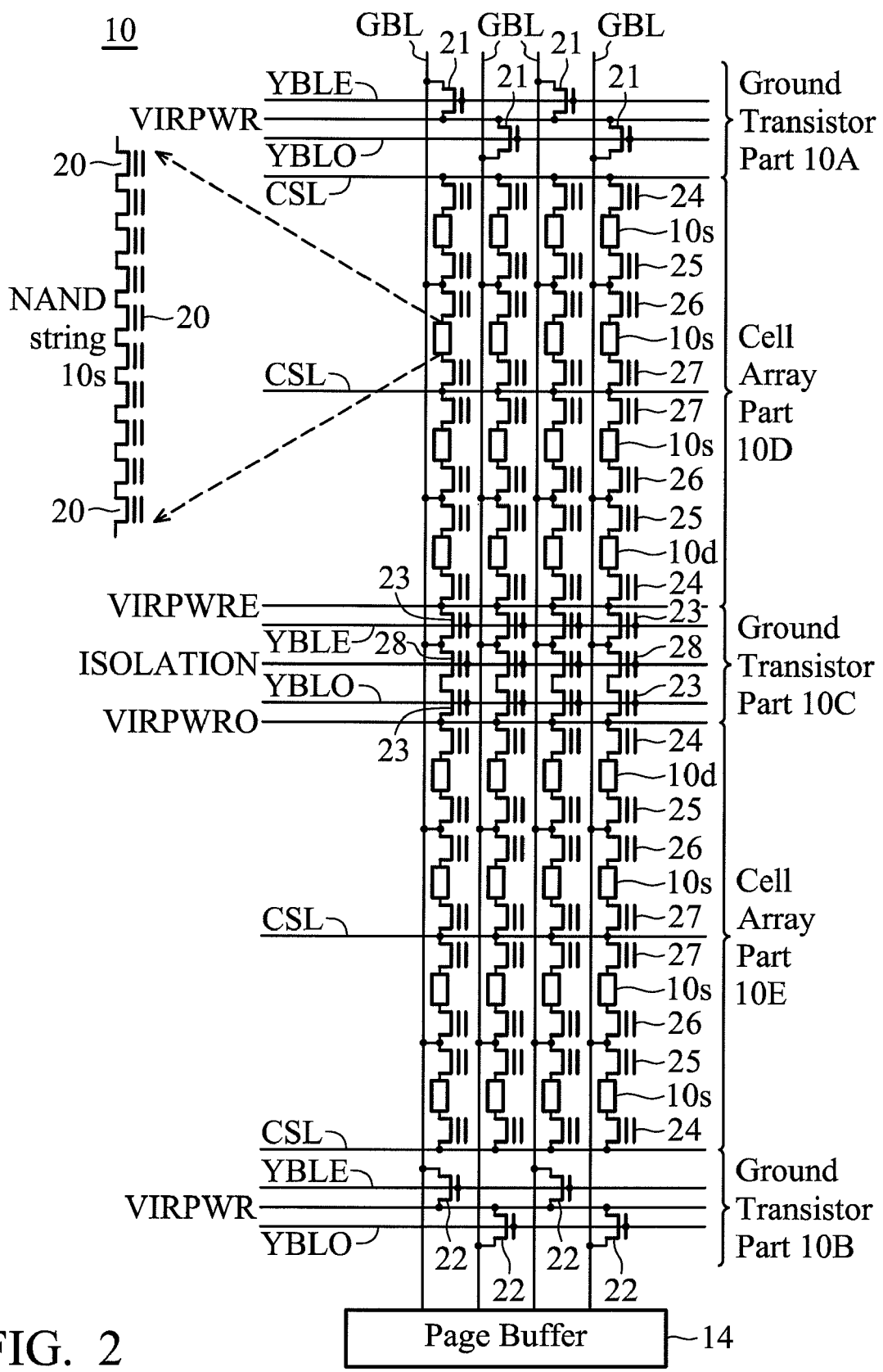
FIG. 2 is a schematic diagram illustrating a memory cell array 10 and a peripheral circuit thereof as shown in FIG. 1.

FIG. 1 is a block diagram illustrating the entire structure of a NAND-type flash electrically-erasable programmable read-only memory (EEPROM) according to an embodiment of the invention. In addition, FIG. 2 is a schematic diagram illustrating a memory cell array 10 and a peripheral circuit thereof as shown in FIG. 1. The structure of the NAND-type flash EEPROM in accordance with the embodiment is illustrated as follows.

Referring to FIG. 1, the NAND-type flash EEPROM in accordance with the embodiment comprises a memory cell array 10, a control circuit 11 that controls the operation of the memory cell array 10, a row decoder 12, a high voltage generating circuit 13, a data rewriting and readout circuit 14, a column decoder 15, a command register 17, an address register 18, an operation logic controller 19, a data input/output buffer 50 and a data input/output terminal 51.

As shown in FIG. 2, the memory cell array 10 is sequentially arranged by a ground transistor part 10A having a plurality of ground transistors 21, a cell array part 10D, a ground transistor part 10C having a plurality of ground transistors 23, a cell array part 10E, a ground transistor part 10B having a plurality of ground transistors 22, and a page buffer 14. In this case, the ground transistor part 10C is specifically arranged for the memory cell array 10 of this embodiment. Each ground transistors 23 is disposed at a position of the global bit line (preferably in the middle position) and operated as a switch component for connecting the global bit line with predetermined power lines VIRPWRE or VIRPWRO, so as to form the ground transistor part 10C. In this case, each ground transistor 23, activated by the control circuit 11, is adjacent to the global bit line where the data is readout and is connected to the global bit line where the data is not readout, so as to connect the global bit line GBL to the ground (preferably setting it to a low voltage near a predetermined ground voltage). Additionally, each ground transistor 23 is formed with the same structure as the selection gate transistors 24, 25, 26 and 27.

Figure 13:
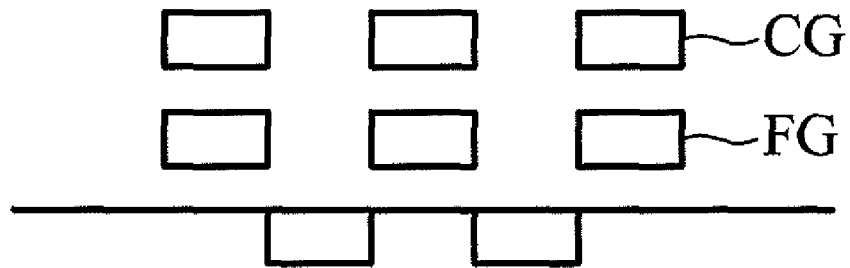
FIG. 13 illustrates a cross section of the memory cell transistor 20 as shown in FIG. 2.
Figure 14:
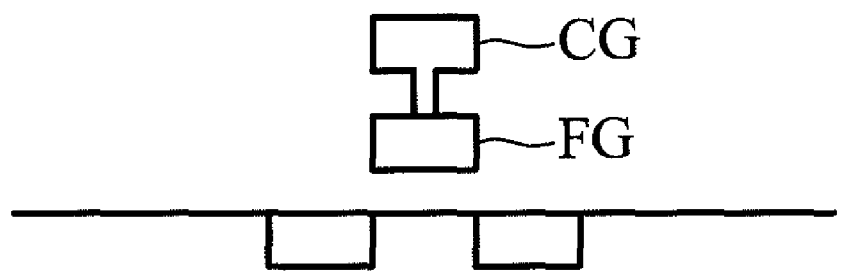
FIG. 14 illustrates a cross section of the selection gate transistors 24-27 as shown in FIG. 2.
Figure 2:
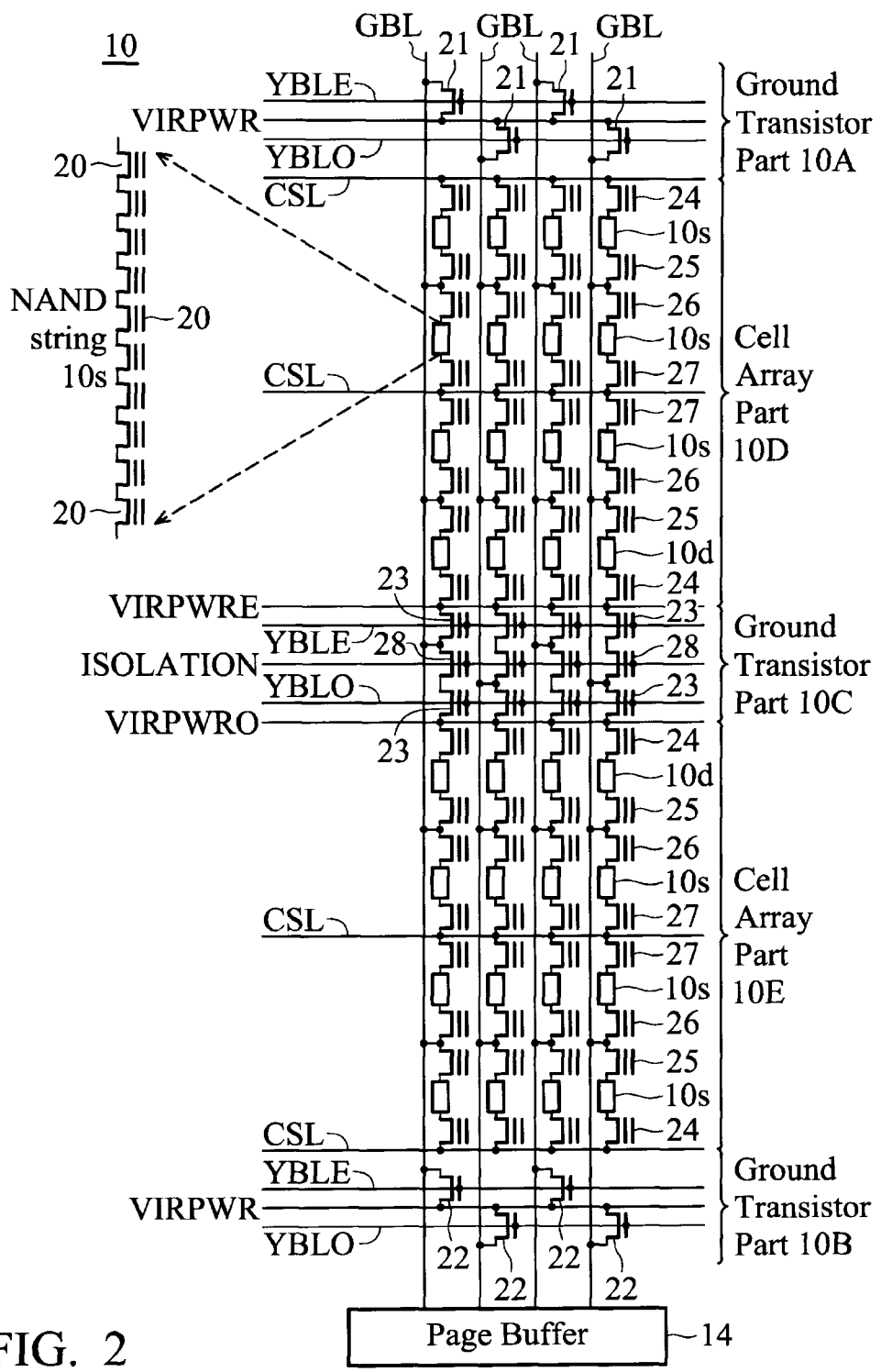

Referring to FIG. 2, in the cell array part 10D and 10E of the memory cell array 10, a NAND string 10s comprises a plurality of electrically rewritable non-volatile memory cells with stacked gate structures connected in series. Each NAND string 10s comprises a plurality of memory cell transistors 20 connected in series, wherein the drain terminal is connected to the global bit line GBL through the selection gate transistors 25 or 26 and the bit line, and the source terminal is connected to a control line CSL, that is a common source line, through the selection gate transistors 24 or 27. In this regard, the global bit lines GBL are connected to the page buffer 14 for reading and writing data. In addition, according to the embodiment of FIG. 2, a plurality of dummy transistors are connected in series to form a dummy NAND string 10d, but the invention is not limited to this arrangement. Thus, as shown in FIG. 13, a control gate CG and a floating gate FG are not connected to form a memory cell transistor 20. Additionally, as shown in FIG. 14, the control gate CG and the floating gate FG are connected to form the selection gate transistors 24-27. The control gate of each NAND string 10s arranged in parallel in a row direction is respectively connected to a word line. Note that one page, which indicates a range of the memory cells selected by one word line, is a unit for write-in or readout. One block, which indicates a range of a plurality of NAND strings 10s within one page or integral multiples of one page, is a unit for data erasing. As shown in FIG. 1, the rewriting and readout circuit 14 hereinafter referred to as a page buffer comprises a sense amplifier circuit (SA) and a latch circuit (DL) positioned on each bit line for data write-in and readout by the unit of one page.

The memory cell array 10 in FIG. 2 has a simplified structure and a plurality of the bit lines may also share a page buffer. In this case, when data write-in or readout is performed, the number of the bit lines selectively connected to the page buffer becomes the unit of one page. Referring to FIG. 1, the row decoder 12 and the column decoder 15 are provided for respectively selecting the word line and the bit line of the memory cell array 10. In addition, the control circuit 11 controls the sequence of data write-in, erasing and readout. The high voltage generating circuit 13 controlled by the control circuit 11 is provided to generate a high voltage and a middle voltage for data write-in, erasing and readout.

The data input/output buffer 50 is used for data input/output and input of address signals. That is, data transmission is performed between the data input/output terminal 51 and the page buffer 14 through the data input/output buffer 50. The address signals input from the data input/output terminal 51 are stored in the address register 18 and then sent to the row decoder 12 and the column decoder 15 for decoding. The command to control operations is also input from the data input/output terminal 51. The input command is decoded and stored in the command register 17 to control the control circuit 11. The external control signals, such as chip enable signals CEB, command latch enable signals CLE, address latch enable signals ALE, write-in enable signals WEB, read-out enable signals REB, etc, are readout to the operation logic controller 19, wherein the inner control signals corresponding to an operation mode are then generated. The inner control signals are provided to control the data latch or transmission of the data input/output buffer 50 and are further transmitted to the control circuit 11.

The ground transistor part 10C is arranged between the cell array part 10D and 10E in the aforementioned memory cell array 10. The ground transistors 23 is disposed at a position of the global bit line GBL (preferably in the middle position) and operated as a switch component for connecting the global bit line to the predetermined power lines VIRPWRE or VIRPWRO; thus forming the ground transistor part 10C. In this case, the ground transistor 23, activated by the control circuit 11, is adjacent to the global bit line GBL where data is readout and is connected to the global bit line GBL where data is not readout, so as to connect the global bit line GBL to the ground (preferably utilizing the source line of the memory cell transistor 20, or setting it to a low voltage near a predetermined ground voltage). Note that the ground transistor 23 is formed with the same structure as the selection gate transistors 24, 25, 26 and 27. In the ground part 10C as shown in FIG. 2, each ground transistor 23 connects the even number of the global bit lines GBL and the odd number of the global bit lines GBL to respective predetermined power lines VIRPWRE or VIRPWRO. Moreover, each ground transistor 23 is also used to reset the voltage of the bit lines. Further, as shown in FIG. 2, the component 28 is an isolation transistor.

Figure 3:
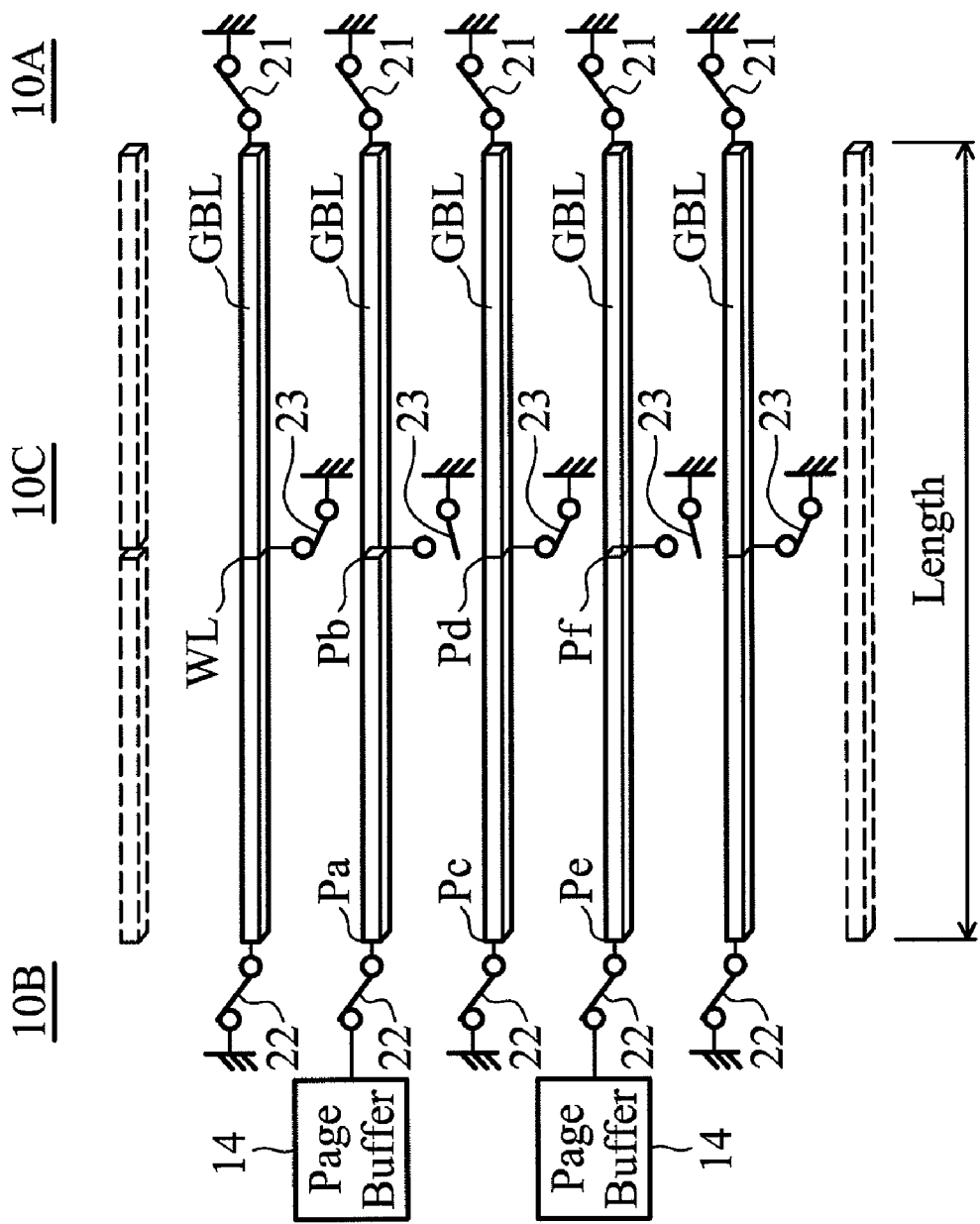
FIG. 3 is a schematic diagram illustrating grounding of the global bit line GBL by the ground transistor 23 of the memory cell array 10 as shown in FIG. 1.
Figure 12:
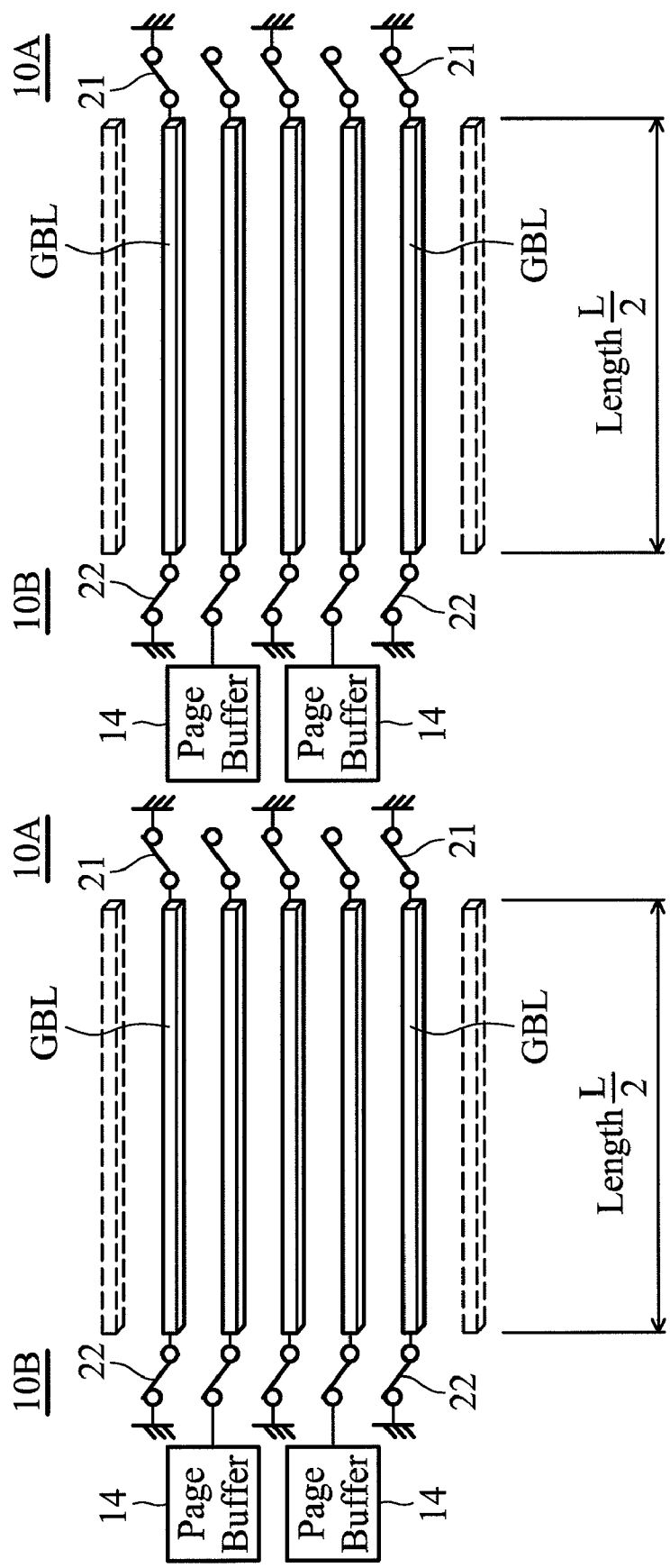
FIG. 12 is a schematic diagram illustrating the ground transistor parts 10A and 10B of another memory cell array according to the prior art.

The description of the memory cell array 10 of the embodiment is illustrated in detail as follows. FIG. 3 is a schematic diagram illustrating grounding of the global bit line GBL by the ground transistor 23 of the memory cell array 10 as shown in FIG. 1. Referring to FIG. 3, a ground transistor part 10C having a plurality of ground transistors 23 is arranged within each global bit line GBL to maintain shielding effectiveness. Each ground transistor 23 of the ground transistor part 10C and selection gate transistors 24, 25, 26, and 27 may be formed by the same layout structure to facilitate the implementation of the memory cell array. Compared with the additional page buffer row as shown in FIG. 12, although such a layout structure as described previously may somewhat increase the chip size, the increased size is substantially small.

Figure 4:
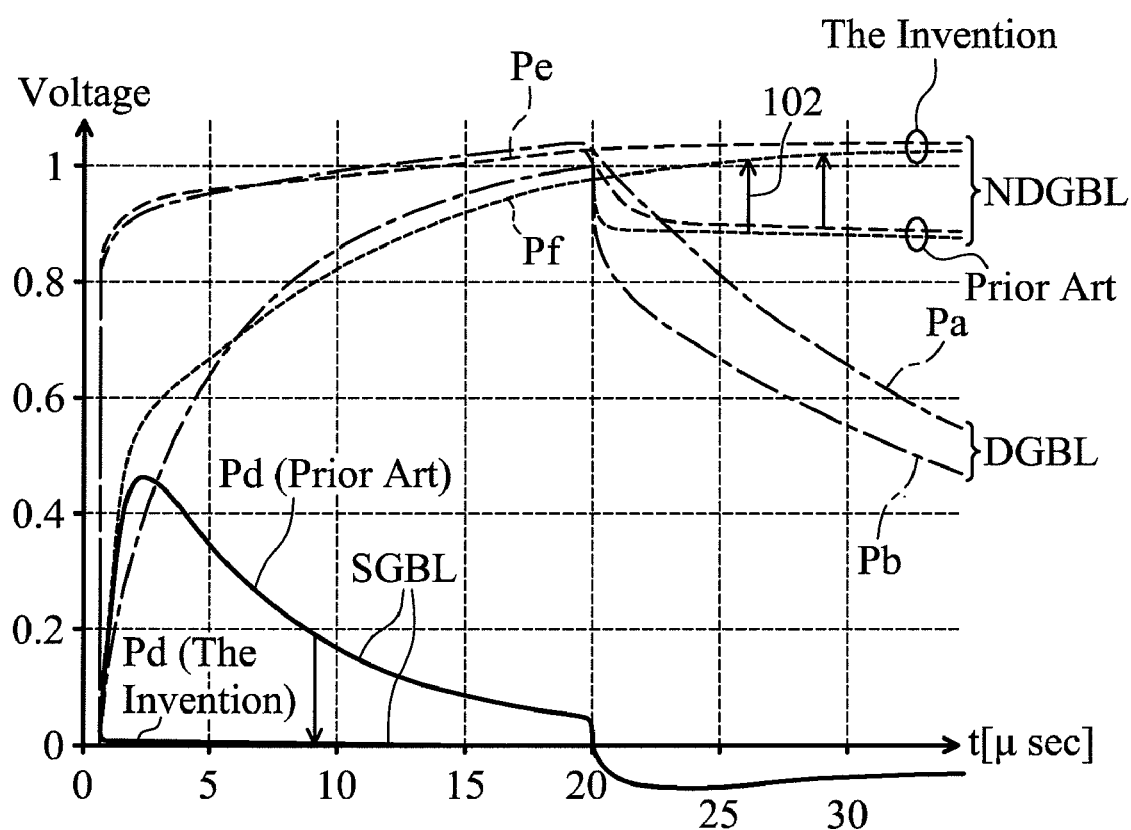
FIG. 4 is a diagram illustrating voltage variation of the global bit line in the memory cell array 10 as shown in FIG. 1.
Figure 11:
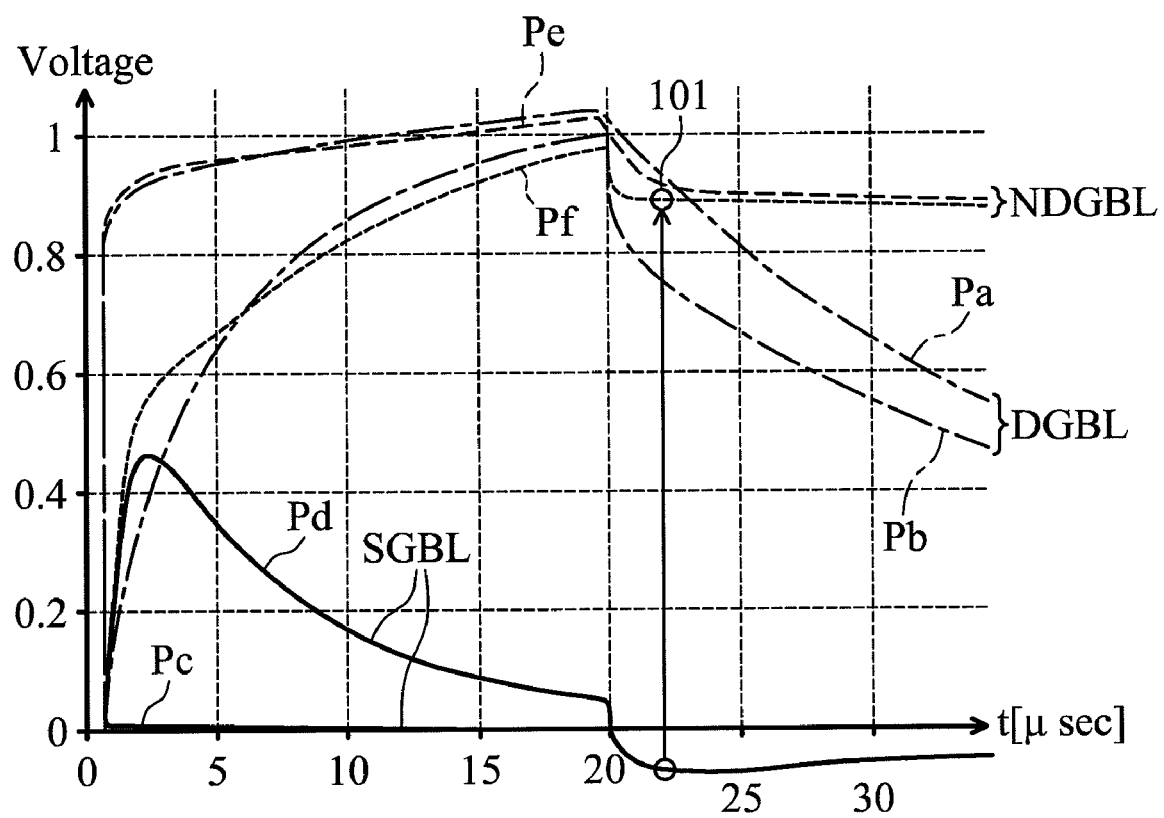
FIG. 11 is a timing diagram illustrating the operation of the circuit as shown in FIG. 10.

FIG. 4 is a diagram illustrating voltage variation of the global bit line in the memory cell array 10 as shown in FIG. 1. Referring to FIG. 4, SGBL indicates a shielded global bit line, DGBL indicates a global bit line where charges have been discharged from the memory cell and NDGBL indicates a global bit line where charges have not been discharged from the memory cell. That is, FIG. 4 is an opposing diagram of FIG. 11. Referring to FIG. 3, a ground transistor 23 is added at the middle point Pd of the global bit line GBL. Thus, as shown in FIG. 4, the waveform of the point Pd is substantially the same with the waveform of the point Pc (102 of FIG. 4). Further, coupling noise due to transmission between the point Pe and Pf may be small enough to be ignored, and occurrence of misreading of the page buffer 14 connecting to the point Pe accordingly is not present. As such, the chip size may not increase, and the shield effectiveness may reduce coupling noise of the global bit line GBL and prevent occurrence of misreading.

Figure 5:
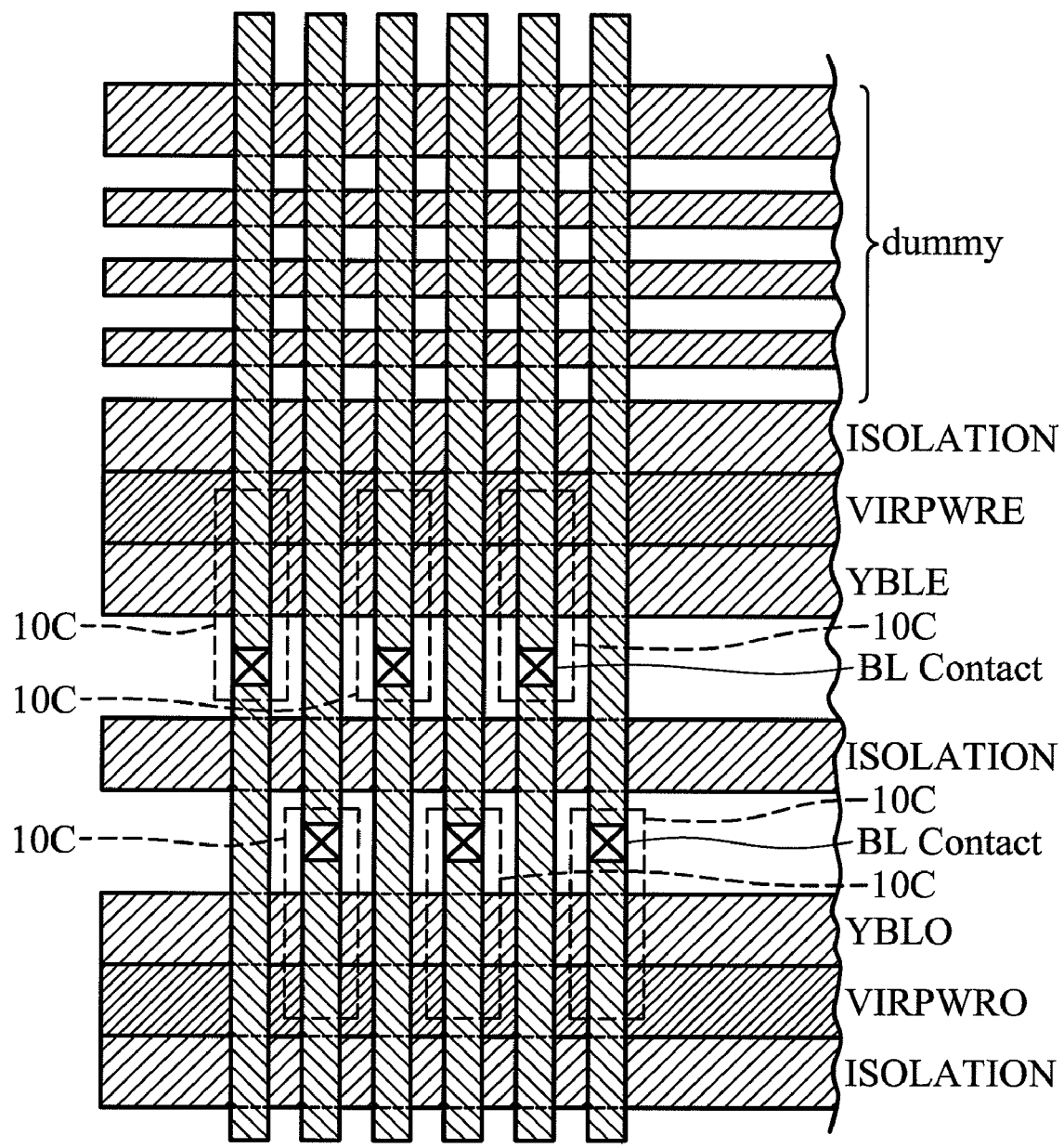
FIG. 5 is a plan view illustrating an arrangement of the memory cell array 10 having the ground transistor part 10C as shown in FIG. 2.

FIG. 5 is a plan view illustrating an arrangement of the memory cell array 10 having the ground transistor part 10C as shown in FIG. 2. Referring to FIG. 5, assume that word lines WL/bit lines BL are formed by predetermined lines and spaces in the memory cell array 10. Thus, for optimization of process conditions, it is not preferable to arrange the peripheral transistors with different design rules in the memory cell array 10. Accordingly, the same structure as the selection gate transistors is used as the ground transistor 23 of the ground transistor part 10C in memory cell array 10. That is, the ground transistor 23 is formed with the structure of the selection transistors 24-27, so the memory cell array 10 may remain compact without significantly increasing process time.

Figure 6:
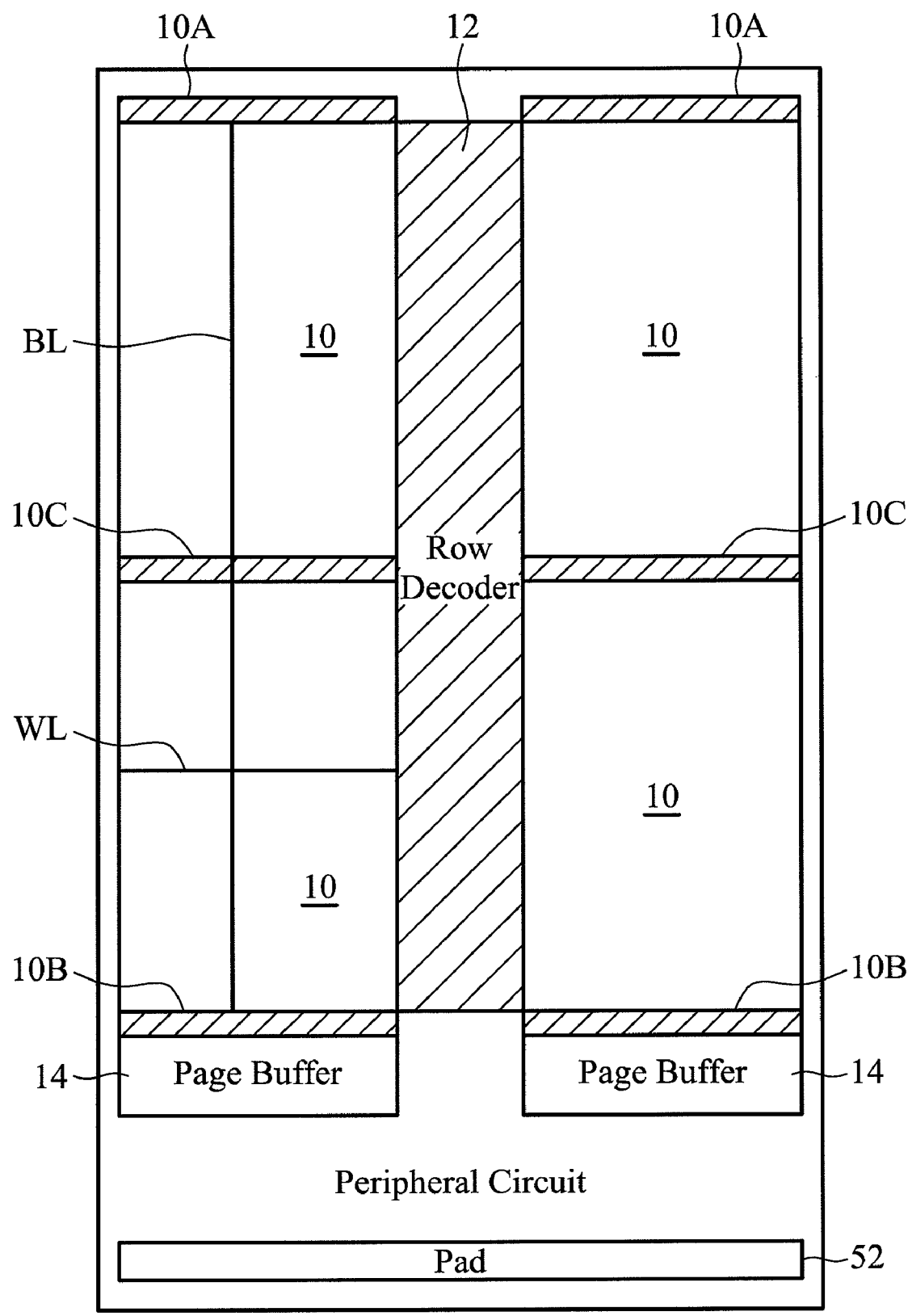
FIG. 6 is a plan view illustrating an arrangement of the memory cell array 10 having the ground transistor part 10C and a peripheral circuit thereof as shown in FIG. 2.

FIG. 6 is a plan view illustrating an arrangement of the memory cell array 10 having the ground transistor part 10C and a peripheral circuit thereof as shown in FIG. 2. Referring to FIG. 6, similar to the prior art, the ground transistor parts 10A and 10B are arranged on global bit lines GBL at the nearest and farthest terminals of the page buffer 14, and the ground transistor 23 of the ground transistor part 10C is arranged at the center of the memory cell array 10 (or alternatively arranged at a plurality of center positions).

Figure 7:
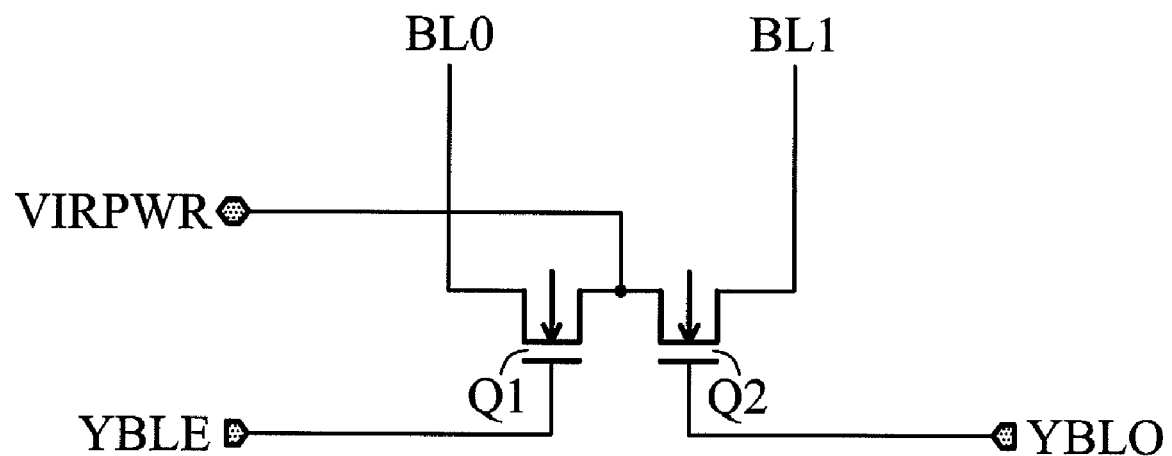
FIG. 7 is a schematic diagram of the ground transistor part 10A as shown in FIG. 2.

FIG. 7 is a schematic diagram of the ground transistor part 10A as shown in FIG. 2. The ground transistor part 10A is formed by the ground transistors Q1 and Q2 which are respectively connected to the bit lines BL0 and BL1, and is controlled by the gate voltage of control lines YBLE or YBLO so as to connect to the power line voltage VIRPWR. That is, the ground transistor of the ground transistor part 10A is the ground transistor which is arranged to connect to the global bit line at a far terminal of the page buffer 14 and the layout is disposed by the design rule of the peripheral transistors; thus having a larger size when compared with the layout by the process rule of the memory cell array 10.

Figure 8:
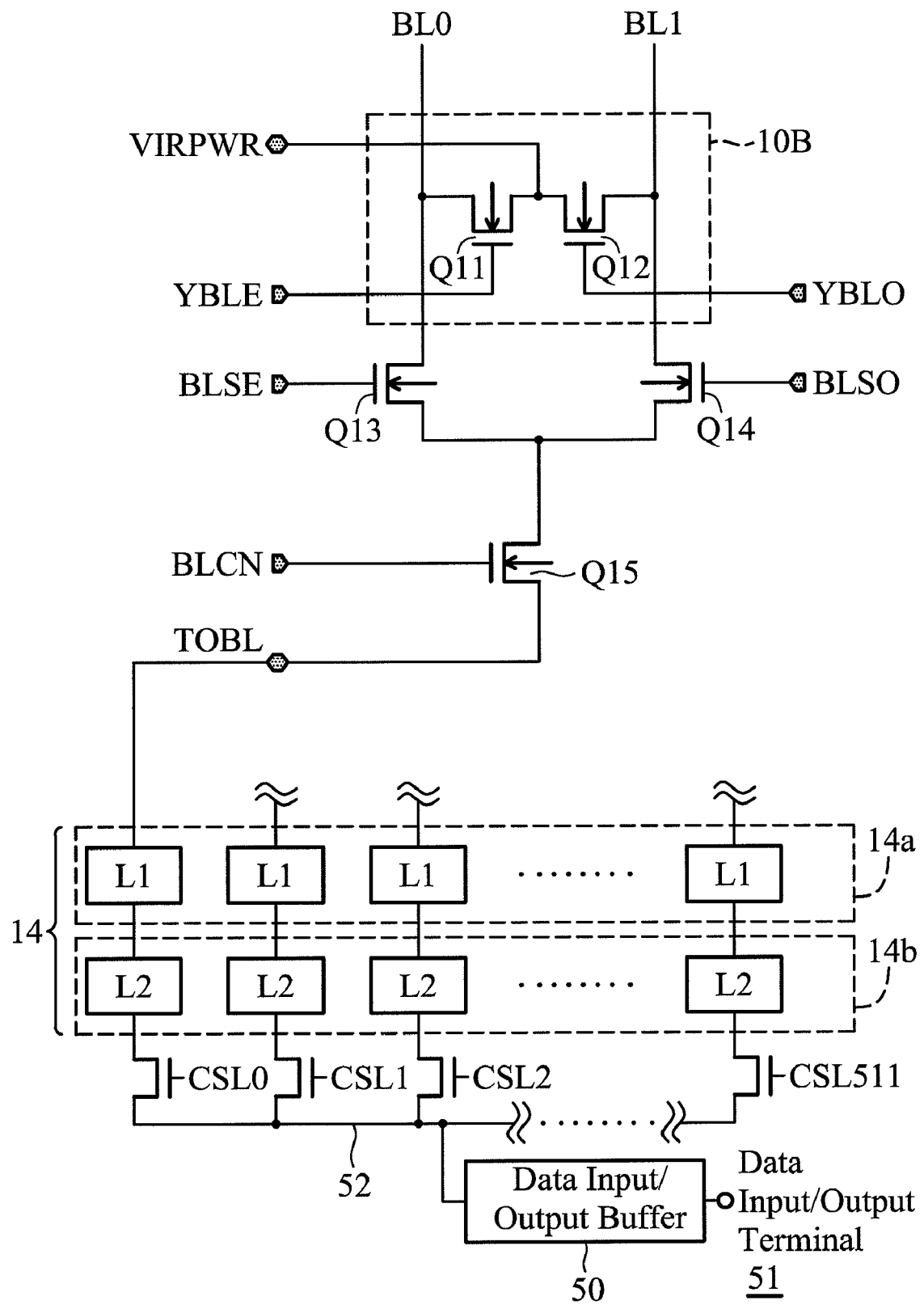
FIG. 8 is a schematic diagram illustrating an arrangement of the ground transistor part 10B, the page buffer 14, and a peripheral circuit thereof as shown in FIG. 2.

FIG. 8 is a schematic diagram illustrating an arrangement of the ground transistor part 10B, the page buffer 14, and a peripheral circuit thereof as shown in FIG. 2. The ground transistor part 10B is formed by the ground transistors Q11 and Q12 which are respectively connected to the bit lines BL0 and BL1, and is controlled by the gate voltage of control lines YBLE or YBLO so as to connect to the power line voltage VIRPWR. The bit lines BL0 and BL1 are connected to the page buffer 14 through the selection transistors Q13 or Q14, and the bit line control transistor Q15. The page buffer 14 comprises a latch circuit 14a having latches L1 and a latch circuit 14b having latches L2, like the prior art. The page buffer 14 is connected to the data input/output terminal 51 through selection transistors CSL0-CLS511, the data line 52 and the data input/output buffer 50. Moreover, similar to the ground transistor part 10A, the peripheral transistors are used to form the ground transistor part 10B, which is arranged on the page buffer 14 side of the global bit line GBL.

Figure 9:
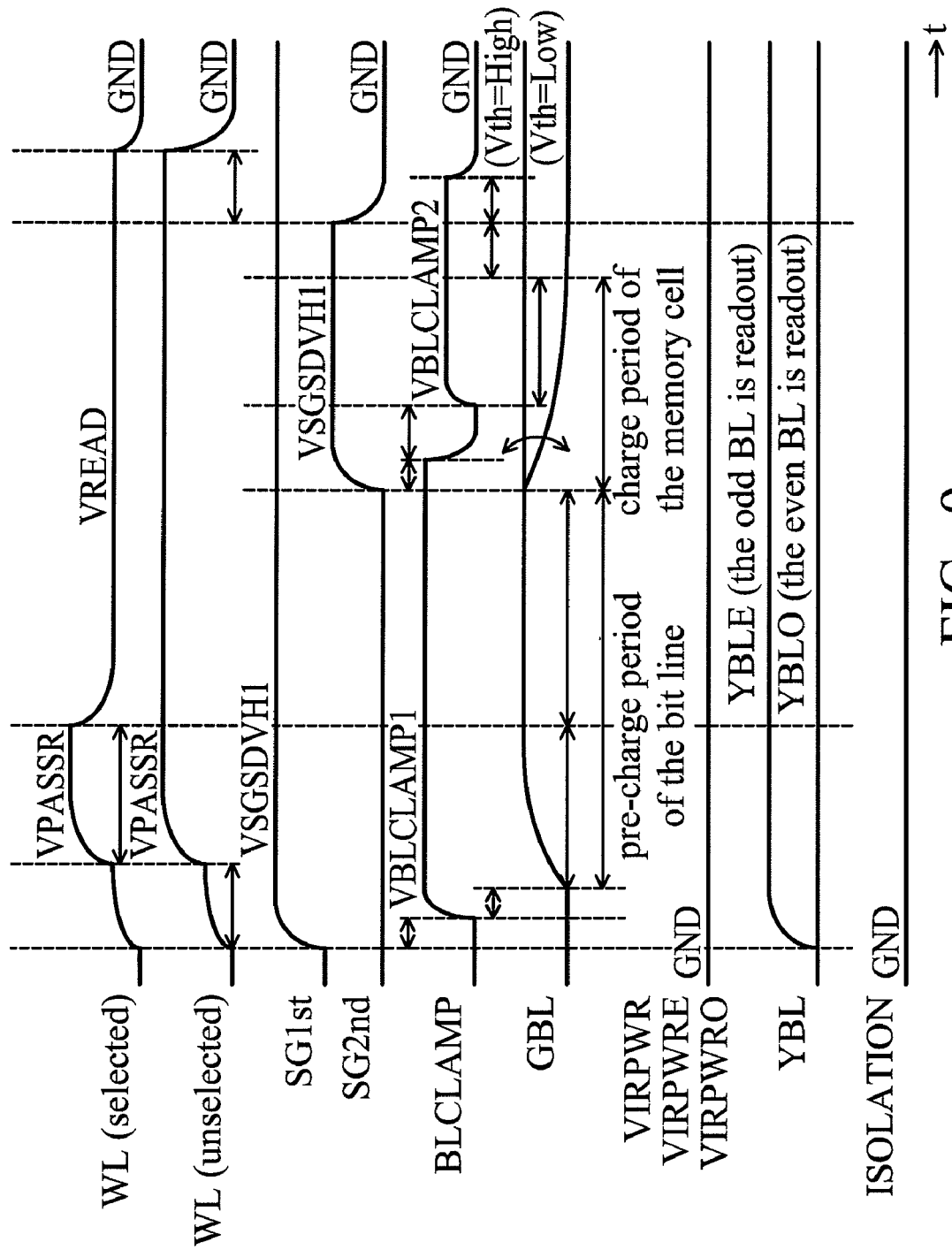
FIG. 9 is a timing diagram illustrating the operation of the circuit as shown in FIGS. 2 to 8.
Figure 10:
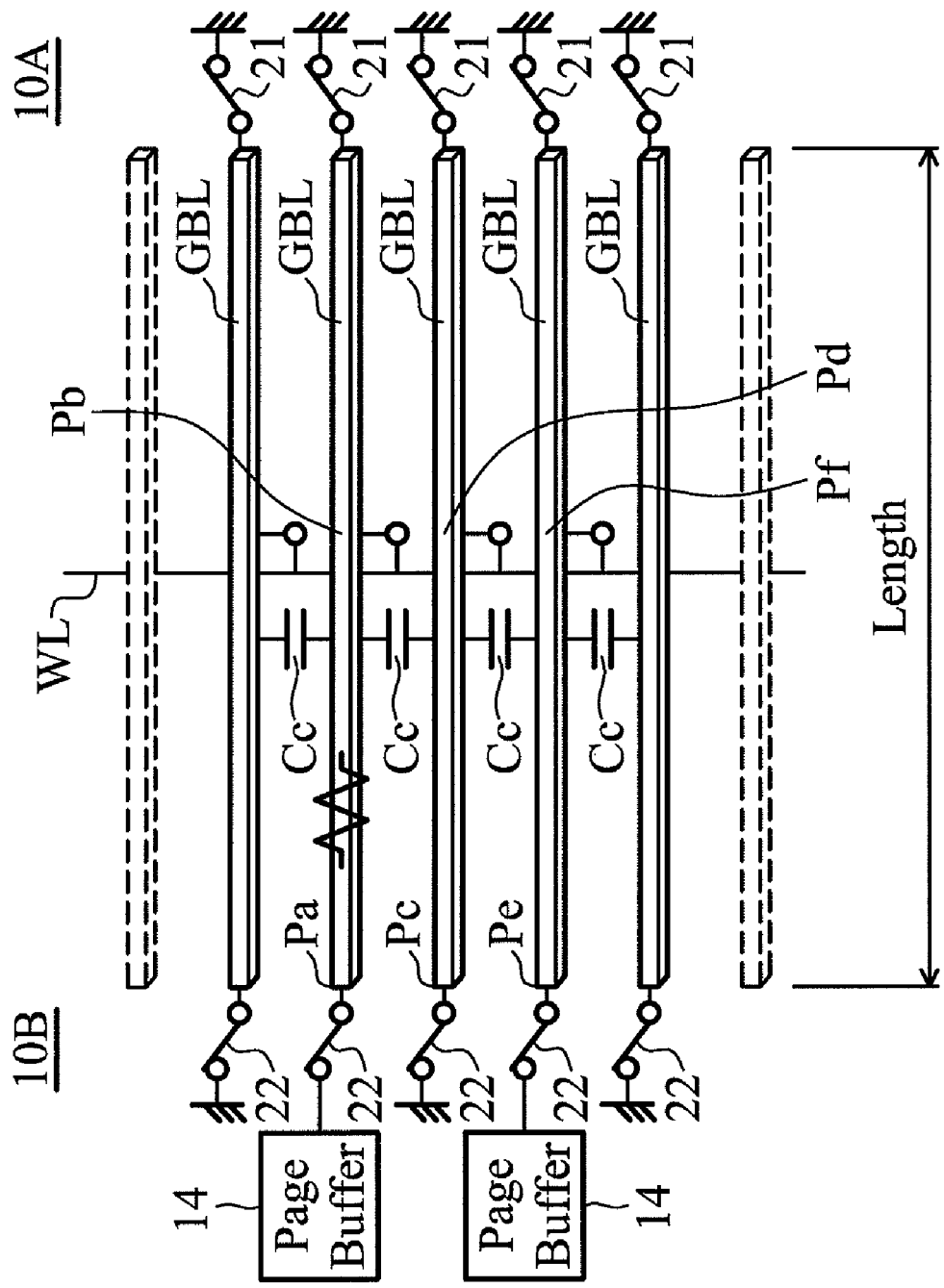
FIG. 10 is a schematic diagram illustrating ground transistor parts 10A and 10B of a memory cell array according to the prior art.

FIG. 9 is a timing diagram illustrating the operation of the circuit as shown in FIGS. 2 to 8. Referring to FIG. 9, SG indicates a control voltage of the selection transistor. During a data readout operation, 0V is supplied to the power line voltage VIRPWR (including VIRPWRE and VIRPWRO) as a source potential voltage of the NAND string 10s. Additionally, the same potential voltage 0V as the power line voltage VIRPWR is also supplied to an isolation electrode ISOLATION. Corresponding to the global bit line GBL performing data readout, a high-level voltage is supplied to one of the control voltages YBLE/YBLO and the same potential voltage 0V as the power line voltage VIRPWR is supplied to the other one of the control voltages YBLE/YBLO, so as to select one transistor. In this case, when data is readout from the memory cell, the bit line is pre-charged by a predetermined pre-charge voltage. Then, charges from the memory cell are discharged, and the detecting voltage of the bit line and a predetermined threshold voltage are compared to determine a data value of the memory cell. According to this embodiment, the ground transistor 23 turned on by the control circuit 11 is adjacent to the global bit line GBL where data is readout and is connected to the global bit line GBL where data is not readout, so as to shield the unselected global bit line GBL. As such, occurrence of misreading induced by capacitance between adjacent global bit lines GBL is prevented.

From the aforementioned description, according to the non-volatile semiconductor memory device of the invention, a switch component to connect a global bit line with a predetermined power line is disposed at a position of the global bit line. The above-mentioned switch component, which is turned on by the control circuit, is adjacent to the global bit line where data is read and is connected to the global bit line where data is not read. Therefore, the chip size may not increase and occurrence of misreading induced by capacitance of adjacent global bit lines GBL may be prevented.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

SYMBOL DESCRIPTION OF THE DRAWINGS

10~memory cell array;
10A, 10B, 10C~ground transistor part;
10D, 10E~cell array part;
10d~NAND dummy string;
10s~NAND string;
11~control circuit;
12~row decoder;
13~high voltage generating circuit;
14~data rewriting and readout circuit (page buffer);
14a, 14b~latch circuit;
15~column decoder;
17~command register;
18~address register;
19~operation logic controller;
20~memory cell transistor;
21, 22, 23, Q1, Q2, Q11, Q12~ground transistor;
24, 25, 26, 27, Q13, Q14'~selection gate transistor;
28~isolation transistor;
50~data input/output buffer;
51~data input/output terminal;
52~data line;
BL, BL0, BL1~bit line;
Cc~capacitance;
CG~control gate;
CSL0-CSL511~selection transistor;
FG~floating gate;
GBL~global bit line;
L1, L2~latch;
Q15~bit line control transistor; and
WL~word line.

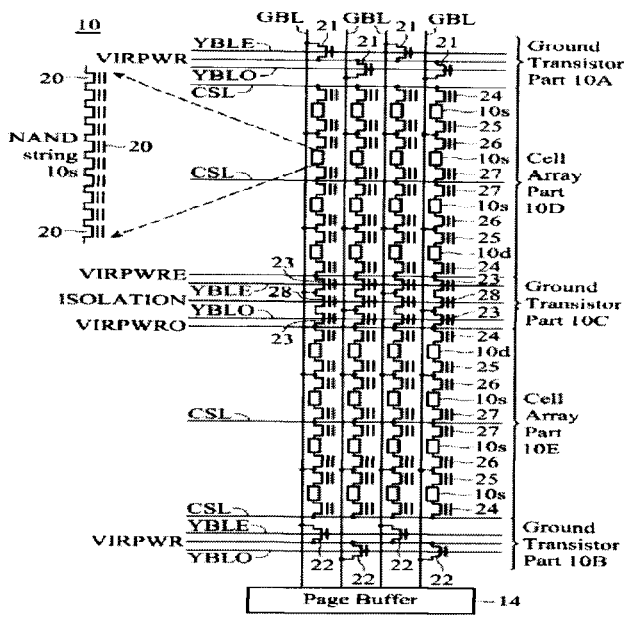

What is claimed is:

1. A non-volatile semiconductor memory device, comprising:
   a non-volatile memory cell array for recording data by setting a threshold voltage for each memory cell transistor, wherein each memory cell transistor is connected in series between selection gate transistors on two terminals of a selected bit line;
   a control circuit for reading a bit line and data from the memory cell transistor through a global bit line commonly connected to a plurality of the bit lines; and
   a switch component being disposed in the non-volatile memory cell array, wherein one end of the switch component is directly connected to a middle position of the global bit line, and another end of the switch component is directly connected to a power line with a ground voltage level.

2. The non-volatile semiconductor memory device as claimed in claim 1, wherein the switch component connects the odd number of the global bit lines and the even number of the global bit lines to respective predetermined power lines.

3. The non-volatile semiconductor memory device as claimed in claim 1, wherein the switch component turned on by the control circuit is adjacent to the global bit line where data is readout and is connected to the global bit line where data is not readout.

4. The non-volatile semiconductor memory device as claimed in claim 1, wherein the switch component is formed with the same structure as the selection gate transistor.

5. The non-volatile semiconductor memory device as claimed in claim 1, wherein the power line is a source line of the memory cell transistor.

6. The non-volatile semiconductor memory device as claimed in claim 1, wherein the memory cell array comprises a plurality of memory cell transistors of a NAND string.

* * * * *

UNITED STATES PATENT AND TRADEMARK OFFICE
CERTIFICATE OF CORRECTION

| | |
|---|---|
| PATENT NO. | : 8,279,673 B2 |
| APPLICATION NO. | : 12/640848 |
| DATED | : October 2, 2012 |
| INVENTOR(S) | : Furuyama |

It is certified that error appears in the above-identified patent and that said Letters Patent is hereby corrected as shown below:

The Title Page, showing an illustrative figure, should be deleted and substitute therefor the attach title page.

In the Drawings:

Delete drawing sheet 2 and substitute therefor the drawing sheet, consisting of fig. 2 as shown on the attached page.

Signed and Sealed this
Sixth Day of August, 2013

Teresa Stanek Rea
*Acting Director of the United States Patent and Trademark Office*

United States Patent
Furuyama

(10) Patent No.: US 8,279,673 B2
(45) Date of Patent: Oct. 2, 2012

(54) NON-VOLATILE SEMICONDUCTOR MEMORY

(75) Inventor: Takaaki Furuyama, Tokyo (JP)

(73) Assignee: Powerchip Technology Corporation, Hsinchu (TW)

( * ) Notice: Subject to any disclaimer, the term of this patent is extended or adjusted under 35 U.S.C. 154(b) by 84 days.

(21) Appl. No.: 12/640,848

(22) Filed: Dec. 17, 2009

(65) Prior Publication Data

US 2010/0157677 A1 Jun. 24, 2010

(30) Foreign Application Priority Data

Dec. 18, 2008 (JP) ................. 2008-322407

(51) Int. Cl.
G11C 11/34 (2006.01)

(52) U.S. Cl. ................................ 365/185.17

(58) Field of Classification Search ......... 365/205, 365/206

See application file for complete search history.

(56) References Cited

U.S. PATENT DOCUMENTS

| | | | | |
|---|---|---|---|---|
| 5,969,990 | A * | 10/1999 | Arase | 365/185.25 |
| 7,400,534 | B2 * | 7/2008 | Maejima | 365/185.17 |
| 2009/0004843 | A1 * | 1/2009 | Mokhlesi et al. | 438/622 |
| 2010/0061137 | A1 * | 3/2010 | Kim | 365/102 |

FOREIGN PATENT DOCUMENTS

| | | |
|---|---|---|
| JP | H09-147582 | 6/1997 |
| JP | 2000-285692 | 10/2000 |
| JP | 2001-28575 | 1/2001 |
| JP | 2003-346485 | 12/2003 |
| JP | 2007-123652 | 5/2007 |

OTHER PUBLICATIONS

Tanaka, "A Quick Intelligent Page-Programming Architecture and a Shielded Bitline Sensing Method for 3 V-Only NAND Flash Memory," IEEE Journal of Solid-State Circuits, Nov. 1994, pp. 1366-1373, vol. 29, No. 11.

* cited by examiner

*Primary Examiner* — Huan Hoang
*Assistant Examiner* — Pablo Huerta
(74) *Attorney, Agent, or Firm* — Muncy, Geissler, Olds & Lowe, PLLC

(57) ABSTRACT

A non-volatile semiconductor memory device is provided so that chip size may not increase and occurrence of misreading induced by capacitance of adjacent global bit lines GBL may be prevented, and includes: a non-volatile memory cell array for recording data by setting a threshold voltage for each memory cell transistor serially connected between selection transistors on terminals of a selected bit line; and a control circuit 11 for reading a bit line and data from the memory cell transistor through a global bit line commonly connected to the bit lines. A ground transistor 23 for connecting the global bit line with a predetermined power line is disposed at a position of the global bit line. The ground transistor 23 activated by the control circuit 11 is adjacent to the global bit line where the data is readout and connected to the global bit line where the data is not readout.

6 Claims, 13 Drawing Sheets